United States Patent
Murase et al.

(10) Patent No.: US 8,654,542 B2
(45) Date of Patent: Feb. 18, 2014

(54) HIGH-FREQUENCY SWITCH MODULE

(75) Inventors: Hisanori Murase, Nagaokakyo (JP); Takanori Uejima, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 190 days.

(21) Appl. No.: 13/232,101

(22) Filed: Sep. 14, 2011

(65) Prior Publication Data

US 2012/0242394 A1    Sep. 27, 2012

Related U.S. Application Data

(63) Continuation of application No. PCT/JP2010/054214, filed on Mar. 12, 2011.

(30) Foreign Application Priority Data

Mar. 16, 2009   (JP) ................................ 2009-063300

(51) Int. Cl.
    *H05K 7/02* (2006.01)
    *H05K 7/06* (2006.01)
    *H05K 7/08* (2006.01)
    *H05K 7/10* (2006.01)

(52) U.S. Cl.
    USPC ........... 361/783; 361/782; 361/784; 361/794; 361/795

(58) Field of Classification Search
    USPC ........................ 361/782–784, 792–795, 803
    See application file for complete search history.

(56) References Cited

U.S. PATENT DOCUMENTS

| | | | | |
|---|---|---|---|---|
| 5,912,809 | A * | 6/1999 | Steigerwald et al. | 361/780 |
| 6,359,237 | B1 | 3/2002 | Tohya et al. | |
| 6,573,600 | B2 * | 6/2003 | Kikuchi et al. | 257/750 |
| 7,068,518 | B2 * | 6/2006 | Ueno et al. | 361/760 |
| 7,438,560 | B2 * | 10/2008 | Takahashi | 439/70 |
| 2005/0225955 | A1 * | 10/2005 | Grebenkemper et al. | 361/780 |

FOREIGN PATENT DOCUMENTS

| | | |
|---|---|---|
| JP | 04-133484 U | 12/1992 |
| JP | 2001-053449 A | 2/2001 |
| JP | 2004-260498 A | 9/2004 |
| JP | 2004-260737 A | 9/2004 |
| JP | 2005-260878 A | 9/2005 |

OTHER PUBLICATIONS

Official Communication issued in International Patent Application No. PCT/JP2010/054214, mailed on Jun. 29, 2010.

* cited by examiner

*Primary Examiner* — Tuan T Dinh
(74) *Attorney, Agent, or Firm* — Keating & Bennett, LLP

(57) ABSTRACT

In a high-frequency switch module, a switch IC is mounted on a multilayer board to define a high-frequency switch module. The multilayer board includes two internal wirings and two internal ground electrodes. The internal ground electrodes are spaced apart from each other at an interval when viewed from a lamination direction of the multilayer board. The first internal wiring is located on the upper surface side of the first internal ground electrode, and is entirely separated from an RF wiring, and the first internal wiring includes a power supply wiring for supplying power to the switch IC. The second internal wiring is located on the upper surface side of the second internal ground electrode, and is entirely separated from the power supply wiring, and the second internal wiring includes a signal wiring through which an RF signal propagates.

9 Claims, 4 Drawing Sheets

FIG. 2A
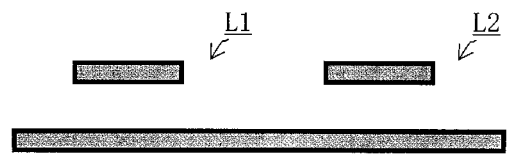
FIG. 2B
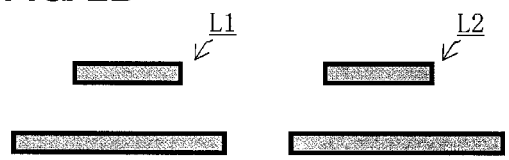
FIG. 2C
|   | isolation L1-L2 |
|---|---|
| A | 40dB |
| B | 52dB |
FIG. 3
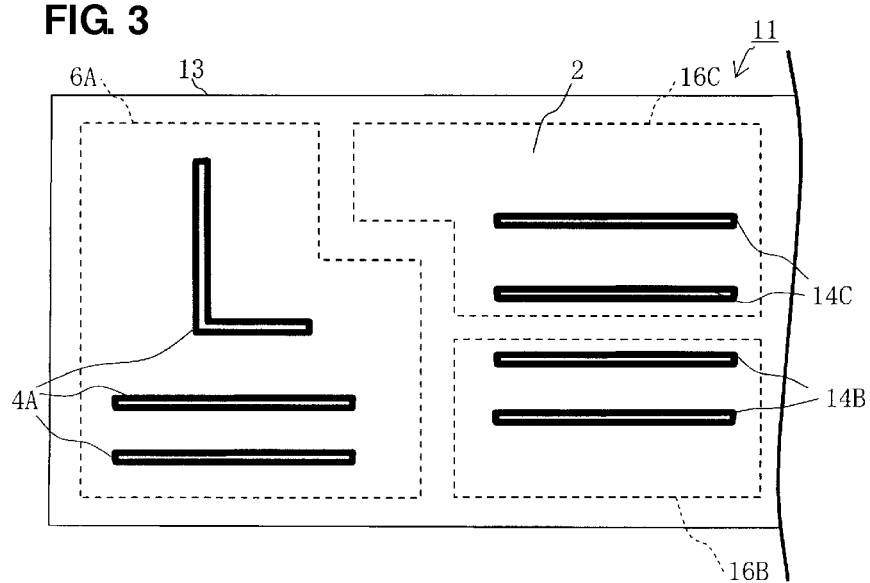

23A 21A 23B 21B 21C 23A   23B 23A   23B 23A   23B 23A   23B 26A   26B

LA < LB < LC

HIGH-FREQUENCY SWITCH MODULE

BACKGROUND OF THE INVENTION

1. Field of the Invention

The present invention relates to a high-frequency switch module including a switch IC that is mounted on a multilayer board.

2. Description of the Related Art

High-frequency switch modules are used in front end portions of mobile phones and other suitable devices. A high-frequency switch module includes a multilayer board and a switch IC mounted thereon. The switch IC connects a selected terminal selected from among a plurality of terminals to a shared terminal. The multilayer board includes surface electrodes connected to terminals of the switch IC, mounting electrodes, and internal electrodes.

In a high-frequency switch module, power noise generated in the outside or in the switch IC may be superimposed on an internal wiring (power supply wiring) for supplying power to the switch IC. A problem arises when the power noise leaks to an internal wiring other than the power supply wiring in the multilayer board. In particular, if the power noise leaks to an internal wiring (transmission wiring) for transmitting a transmission signal when the switch IC is powered on, there is a possibility that a property degradation, such as harmonic distortion, will occur, which is a serious problem.

Therefore, in order to solve this problem, a configuration may be used in which a power supply wiring is sandwiched between internal ground electrodes (see, for example, Japanese Unexamined Patent Application Publication No. 2001-53449).

In Japanese Unexamined Patent Application Publication No. 2001-53449, an internal ground electrode for preventing power noise superimposed on a power supply wiring from leaking to another internal wiring is provided on an entire predetermined interface within a multilayer board. Thus, since the internal wiring other than the power supply wiring, a circuit element, or other wiring faces the internal ground electrode, a desired impedance or electrical property may not be obtained. In addition, power noise may leak from the power supply wiring through the internal ground electrode to the other internal wiring.

SUMMARY OF THE INVENTION

To overcome the problems described above, preferred embodiments of the present invention provide a high-frequency switch module in which an internal wiring other than a power supply wiring, a circuit element, or other wiring is easily set to have a desired impedance or electrical property and which prevents leakage of power noise through an internal ground electrode to the internal wiring other than the power supply wiring.

A high-frequency switch module according to a preferred embodiment of the present invention preferably includes a switch IC that is mounted on a multilayer board that includes insulating material layers and electrodes that are laminated, the high-frequency switch module including a power supply wiring, a first signal wiring, and first and second internal ground electrodes. The power supply wiring is preferably an internal wiring arranged to supply power to the switch IC. The first signal wiring is preferably an internal wiring through which a first high-frequency signal propagates. The first and second internal ground electrodes are preferably spaced apart from each other at an interval when viewed from a lamination direction of the multilayer board. An entire or substantially an entire internal wiring located on the switch IC side of the first internal ground electrode is separated from the first signal wiring, and at least a portion thereof defines the power supply wiring. An entire or substantially an entire internal wiring located on the switch IC side of the second internal ground electrode is separated from the power supply wiring, and at least a portion thereof defines the first signal wiring.

With this configuration, the isolation between the internal wiring located on the switch IC side of the first internal ground electrode and the internal wiring located on the switch IC side of the second internal ground electrode is increased. Therefore, noise superimposed on the power supply wiring is effectively prevented from leaking through the first and second internal ground electrodes to the first signal wiring. Further, since the first internal ground electrode facing the power supply wiring is separated, a desired impedance or electrical property of the internal wiring other than the power supply wiring or a circuit element is easily set.

The high-frequency switch module according to a preferred embodiment of the present invention may preferably include a second signal wiring and a third internal ground electrode. The second signal wiring is an internal wiring through which a second high-frequency signal propagates. The third internal ground electrode is located at an interval from the first internal ground electrode and the second internal ground electrode when viewed from the lamination direction of the multilayer board. In this case, preferably, the entire or substantially the entire internal wiring located on the switch IC side of the first internal ground electrode and the entire or substantially the entire the internal wiring located on the switch IC side of the second internal ground electrode are separated from the second signal wiring. Further, preferably, an entire or substantially an entire internal wiring located on the switch IC side of the third internal ground electrode is separated from the first signal wiring and the power supply wiring, and at least a portion thereof defines the second signal wiring.

With this configuration, the isolation among the internal wiring located on the switch IC side of the first internal ground electrode, the internal wiring located on the switch IC side of the second internal ground electrode, and the internal wiring located on the switch IC side of the third internal ground electrode is increased. Therefore, the first and second high-frequency signals and power noise do not leak through the first to third internal ground electrodes.

Preferably, the high-frequency switch module according to a preferred embodiment of the present invention includes a second signal wiring, and at least a portion of the internal wiring located on the switch IC side of the first internal ground electrode defines the second signal wiring. Further, preferably, the entire or substantially the entire internal wiring located on the switch IC side of the second internal ground electrode is separated from the second signal wiring.

With this configuration, at least leakage of the second high-frequency signal through the first and second internal ground electrodes to the first signal wiring is effectively prevented. In addition, leakage of the first high-frequency signal through the second and first internal ground electrodes to the second signal wiring is effectively prevented.

Preferably, the first high-frequency signal according to a preferred embodiment of the present invention is a transmission signal, and the second high-frequency signal is a reception signal. The current amplitude of the transmission signal is greater than the current amplitude of the reception signal, and leakage of the transmission signal to the second signal wiring causes problems, such as harmonic distortion, for example. Thus, when the internal ground electrodes facing the first signal wiring through which the transmission signal propagates and the second signal wiring through which the reception signal propagates are separated from each other, the isolation between the transmission signal and the reception signal is increased, and the problems, such as harmonic distortion, for example, are effectively prevented.

Preferably, the high-frequency switch module according to a preferred embodiment of the present invention includes a fourth internal ground electrode. The fourth internal ground electrode is on the switch IC side of the internal wiring located on the switch IC side of the first internal ground electrode, so as to overlap with the first internal ground electrode when viewed from the lamination direction of the multilayer board. With this configuration, leakage of noise superimposed on the power supply wiring is effectively reduced.

In the high-frequency switch module according to a preferred embodiment of the present invention, preferably, the switch IC is located so as to overlap with the first internal ground electrode when viewed from the lamination direction of the multilayer board. With this configuration, the power supply wiring is reduced in length, and the risk that noise is superimposed on the power supply wiring is significantly reduced and minimized.

In the high-frequency switch module according to a preferred embodiment of the present invention, preferably, the first internal ground electrode and the second internal ground electrode are disposed on different layers of the multilayer board. With this configuration, leakage of noise through the first and second internal ground electrodes is significantly reduced and minimized.

According to a preferred embodiment of the present invention, preferably, an interval between an internal wiring located on the switch IC side of each internal ground electrode and an adjacent internal ground electrode is shorter than an interval between the internal wiring and another adjacent internal wiring. With this configuration, leakage of noise from each wiring is significantly reduced and minimized.

According to a preferred embodiment of the present invention, the first internal electrode and the second internal electrode are arranged so as to be separated from each other, and thus, the isolation between the power supply wiring and the first signal wiring is increased. Therefore, noise superimposed on the power supply wiring is prevented from leaking through the first and second internal ground electrodes to the first signal wiring. Further, since the first internal ground electrode facing the power supply wiring is separated, a desired impedance or electrical property of the internal wiring other than the power supply wiring or a circuit element is easily set.

The above and other elements, features, steps, characteristics and advantages of the present invention will become more apparent from the following detailed description of the preferred embodiments with reference to the attached drawings.

BRIEF DESCRIPTION OF THE DRAWINGS

FIGS. 2A to 2C are diagrams illustrating an experiment to confirm the advantageous effects of a preferred embodiment of the present invention.

FIG. 3 is a view of an exemplary configuration of a high-frequency switch module according to a second preferred embodiment of the present invention.

DETAILED DESCRIPTION OF THE PREFERRED EMBODIMENTS

Hereinafter, an exemplary configuration of a high-frequency switch module according to preferred embodiments of the present invention will be described.

Figure 1A:
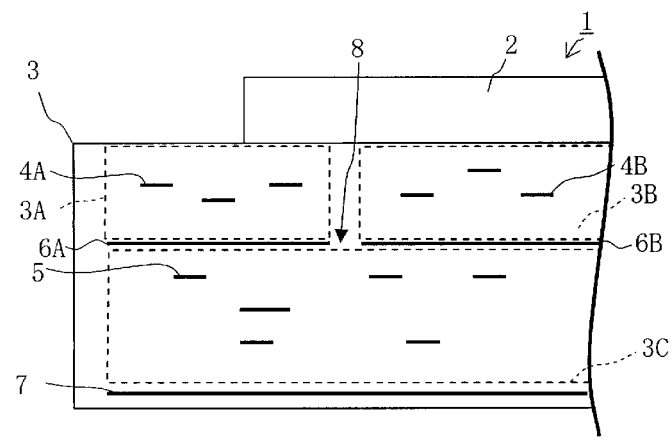
FIGS. 1A and 1B are views of an exemplary configuration of a high-frequency switch module according to a first preferred embodiment of the present invention.
Figure 1B:
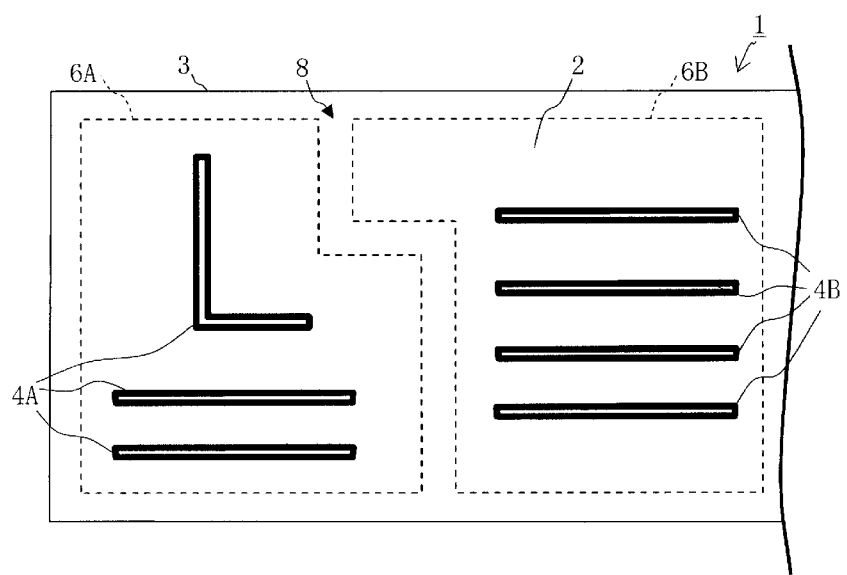
Figure 4A:
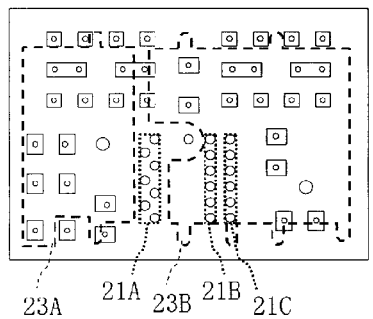
FIGS. 4A to 4F are views of an exemplary configuration of a high-frequency switch module according to a third preferred embodiment of the present invention.
Figure 4B:
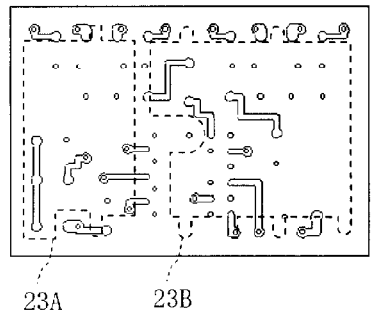
Figure 4C:
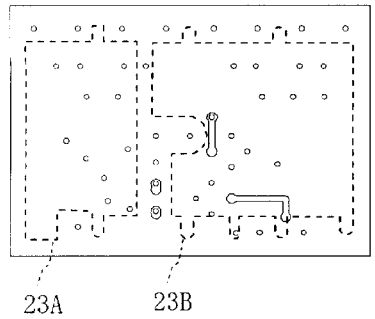
Figure 4D:
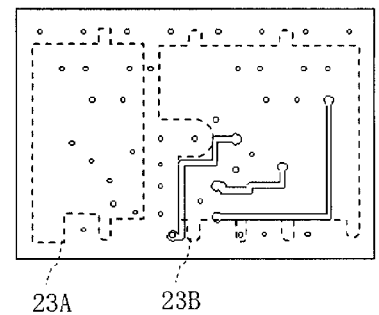
Figure 4E:
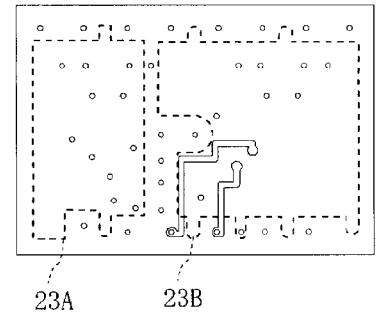
Figure 4F:
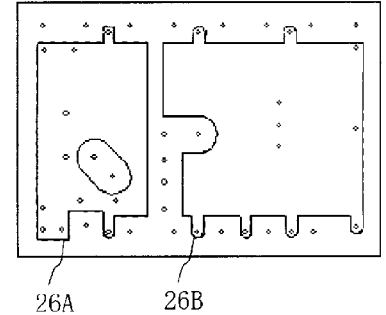

FIG. 1A is a partial cross-sectional view of the high-frequency switch module according to a preferred embodiment of the present invention, and FIG. 1B is a partial plan view of the high-frequency switch module according to the present preferred embodiment as viewed from a predetermined board interface.

The high-frequency switch module 1 preferably includes a switch IC 2 and a multilayer board 3.

The multilayer board 3 preferably includes a plurality of internal wirings 4A, 4B, and 5 and a plurality of internal ground electrodes 6A, 6B, and 7. On a top surface of the multilayer board 3, surface electrodes (not shown) for mounting a plurality of chip elements including the switch IC 2 are preferably provided. On a bottom surface of the multilayer board 3, mounting electrodes (not shown) are preferably provided.

The internal ground electrodes 6A and 6B are provided on the same board interface within the multilayer board 3 and across a slit 8. The internal ground electrode 7 is provided on a board interface within the multilayer board 3 that is adjacent to the bottom surface of the multilayer board 3.

The internal wirings 4A are provided in a wiring region 3A. The wiring region 3A is a region in the multilayer board 3 on the upper surface side of the internal ground electrode 6A. The internal wirings 4A are connected to the surface electrodes and the internal ground electrode 6A.

The internal wirings 4B are provided in a wiring region 3B. The wiring region 3B is a region in the multilayer board 3 on the upper surface side of the internal ground electrode 6B. The internal wirings 4B are connected to the surface electrodes and the internal ground electrode 6B.

The internal wirings 5 are provided in an element region 3C. The element region 3C is a region in the multilayer board 3, on the lower surface side of the internal ground electrodes 6A and 6B, and on the upper surface side of the internal ground electrode 7. In the element region 3C, the internal wirings 5 partially define a circuit element. A portion of the internal wirings 5 is connected to the internal wirings 4A and the internal wirings 4B and connected to the mounting electrodes. In addition, another portion of the internal wirings 5 is connected to the internal ground electrode 6A and the internal ground electrode 6B and connected to the internal ground electrode 7.

The switch IC 2 preferably includes a plurality of terminals (not shown) on a bottom surface thereof. These terminals are mounted on the surface electrodes of the multilayer board 3 and connected to the internal wirings 4A and 4B. In the present preferred embodiment, DC system terminals among the plurality of terminals of the switch IC 2 are preferably connected to any of the internal wirings 4A. The DC system terminals are terminals connected directly or through an impedance element to a power supply line within the switch IC, and include a power supply terminal of the switch IC 2. Therefore, any one of the internal wirings 4A is connected to the power supply terminal of the switch IC 2 and used as a power supply wiring arranged to supply power to the switch IC 2. Then, the internal ground electrode 6A is preferably used as a first internal ground electrode.

Further, RF system terminals among the plurality of terminals of the switch IC 2 are preferably connected to any of the internal wirings 4B. The RF system terminals are terminals connected directly or through an impedance element to an RF line within the switch IC, and include a signal terminal of the switch IC 2. Therefore, any one of the internal wirings 4B is connected to the signal terminal of the switch IC 2 and used as a first signal wiring through which an RF signal propagates. Then, the internal ground electrode 6B is preferably used as a second internal ground electrode.

Terminals among the plurality of terminals of the switch IC 2 other than the DC system terminals and the RF system terminals may be connected to any of the internal wirings 4A and 4B or may be connected to internal wirings provided outside the wiring regions 3A and 3B. In the present preferred embodiment, control system terminals among these terminals are preferably connected to any of the internal wirings 4A. The control system terminals are terminals connected directly or through an impedance element to a control line within the switch IC.

In the above-described configuration, the internal ground electrode 6A and the internal ground electrode 6B are separated from each other by the slit 8. All of the internal wirings 4A are preferably provided in the wiring region 3A without extending into the wiring region 3B and are separated from the RF system terminals of the switch IC 2. All of the internal wirings 4B are preferably provided in the wiring region 3B without extending into the wiring region 3A and are separated from the DC system terminals of the switch IC 2. Due to this arrangement, the isolation between the internal wirings 4A facing the internal ground electrode 6A and the internal wirings 4B facing the internal ground electrode 6B is increased.

Therefore, even if power noise from the DC system terminals is superimposed on the internal wirings 4A, the power noise does not significantly propagate from the internal ground electrode 6A to the internal ground electrode 6B. Thus, leakage of the power noise from the internal wirings 4A to the internal wirings 4B is effectively prevented. It should be noted that in the present preferred embodiment, all of the DC system terminals are connected to the internal wirings 4A. However, leakage of power noise from the power supply wiring can be prevented by connecting at least the power supply terminal to the internal wiring 4A. Since there is the possibility that noise will propagate through the DC system terminals other than the power supply terminal, leakage of the power noise more effectively prevented by connecting also the DC system terminals other than the power supply terminal to the internal wirings 4A.

Further, noise does not significantly propagate from the internal ground electrode 6B to the internal ground electrode 6A, and, for example, the RF signal itself does not leak as noise from the internal wirings 4B to the internal wirings 4A. It should be noted that in the present preferred embodiment, all of the RF system terminals are connected to the internal wirings 4B. However, when at least the first signal terminal is connected to the internal wiring 4B, leakage of power noise to the signal terminal and leak of noise from the signal terminal to the power supply wiring can be reduced. Since there is the possibility that noise will propagate through the RF system terminals other than the signal terminal, leakage of noise can be more effectively prevented by connecting also the RF system terminals other than the signal terminal to the internal wirings 4B.

Further, even if power noise leaks to the control line within the switch IC, noise superimposed on the control system terminals does not significantly propagate from the internal ground electrode 6A to the internal ground electrode 6B. Therefore, leakage of noise from the control system terminals can also be prevented.

FIGS. 2A to 2C are views of an experiment performed to confirm the advantageous effects of a preferred embodiment of the present invention.

Here, a result of simulating isolation between two transmission lines is shown. The configuration shown in FIG. 2A is a configuration in which a ground electrode is integrally defined by the two transmission lines, and the isolation between both transmission lines is about 40 dB, for example. Meanwhile, the configuration shown in FIG. 2B is a configuration in which ground electrodes are separately provided for the two transmission lines, respectively, and the isolation between both transmission lines is about 52 dB. In this manner, in the two transmission lines, the isolation can be improved by separately providing the ground electrodes. Thus, similarly, in the high-frequency switch module, the internal ground electrode is divided to separate the power supply wiring and the signal wiring, whereby it is possible to increase the isolation between the wirings.

Next, a high-frequency switch module according to a second preferred embodiment of the present invention will be described. In the following description, the same components as those in the first preferred embodiment are designated by the same reference signs, and the description thereof is omitted.

FIG. 3 is a partial plan view of the high-frequency switch module according to the second preferred embodiment as viewed from a predetermined board interface.

The high-frequency switch module 11 includes a multilayer board 13.

The multilayer board 13 preferably includes a plurality of internal wirings 4A, 14B, and 14C and a plurality of internal ground electrodes 6A, 16B, and 16C. The internal ground electrodes 6A, 16B, and 16C are preferably provided on the same board interface within the multilayer board 13 and across a slit. The internal wirings 14B are provided in a region in the multilayer board 13 on the upper surface side of the internal ground electrode 16B. The internal wirings 14C are provided in a region in the multilayer board 13 on the upper surface side of the internal ground electrode 16C.

Transmission system terminals among a plurality of terminals of the switch IC 2 are preferably connected to any of the internal wirings 14B. The transmission system terminals are terminals connected directly or through an impedance element to a transmission line within the switch IC, and include a transmission terminal of the switch IC 2. Therefore, any one of the internal wirings 14B is used as the first signal wiring through which a transmission signal propagates. Then, the internal ground electrode 16B is used as the second internal ground electrode.

Reception system terminals among the plurality of terminals of the switch IC 2 are preferably connected to any of the internal wirings 14C. The reception system terminals are terminals connected directly or through an impedance element to a reception line within the switch IC, and include a reception terminal of the switch IC 2. Therefore, any one of the internal wirings 14C is used as a second signal wiring through which a reception signal propagates. Then, the internal ground electrode 16C is used as a third internal ground electrode.

In the above-described configuration, the internal ground electrode 6A, the internal ground electrode 16B, and the internal ground electrode 16C are separated from each other by the slit. Then, all of the internal wirings 4A are preferably arranged without extending into a region facing the internal ground electrodes 16B and 16C, and are separated from the transmission system terminals and the reception system terminals of the switch IC 2. All of the internal wirings 14B are preferably arranged without extending into a region facing the internal ground electrodes 6A and 16C, and are separated from the DC system terminals and the reception system terminals of the switch IC 2. All of the internal wirings 14C are preferably arranged without extending into a region facing the internal ground electrodes 6A and 16B, and are separated from the DC system terminals and the transmission system terminals of the switch IC 2. Due to this arrangement, the isolation among the internal wiring 4A, the internal wiring 14B, and the internal wiring 14C is increased.

Therefore, even if power noise is superimposed on the internal wirings 4A, the power noise does not significantly propagate from the internal ground electrode 6A to the internal ground electrode 16B or the internal ground electrode 16C. Thus, leakage of the power noise to the internal wirings 14B or the internal wirings 14C is prevented.

Further, noise does not significantly propagate from the internal ground electrode 16B to the internal ground electrode 6A or the internal ground electrode 16C, and, for example, the transmission signal itself does not leak as noise from the internal wirings 14B to the internal wirings 4A or the internal wirings 14C.

It should be noted that in the second preferred embodiment, the transmission system terminals and the reception system terminals are all preferably connected to the internal wirings 14B and 14C, respectively. However, when at least the transmission terminal is connected to the internal wiring 14B and at least the reception terminal is connected to the internal wiring 14C, leakage of power noise to these signal terminals can be prevented. In addition, since there is the possibility that noise will leak through the transmission system terminals and the reception system terminals other than these signal terminals, leakage of noise can be more effectively prevented by connecting also the transmission system terminals and the reception system terminals other than the signal terminals to the internal wirings 14B and 14C.

Next, a high-frequency switch module according to a third preferred embodiment of the present invention will be described.

FIGS. 4A to 4F are partial lamination diagrams of the high-frequency switch module according to the third preferred embodiment, and FIGS. 4A to 4F are exploded plan views, respectively, when boards A to F are viewed from their top surfaces.

The high-frequency switch module of the third preferred embodiment includes a multilayer board that includes the laminated boards A to F.

The board A includes a top surface that is a top surface of the multilayer board and that is a mounting surface for a switch IC. On the top surface of the board A, a plurality of surface electrodes for mounting a plurality of chip elements including the switch IC are preferably provided. The board B to board E are provided as the second to fifth layers from the board A, and preferably include a plurality of pattern electrodes and a plurality of via electrodes constituting internal wirings. The board F is provided as the sixth layer from the mounting surface for the switch IC, and internal ground electrodes 26A and 26B are preferably provided on its top surface.

Of the surface electrodes provided on the board A, preferably, a surface electrode 21A is located between a wiring region 23A facing the internal ground electrode 26A and a wiring region 23B facing the internal ground electrode 26B, and the transmission system terminals of the switch IC are mounted thereon. A surface electrode 21B is located in the wiring region 23B, and the reception system terminals of the switch IC are mounted thereon. A surface electrode 21C is located in the wiring region 23B, and the DC system terminals of the switch IC are mounted thereon.

Internal wirings that extend to the surface electrode 21A preferably include an internal wiring corresponding to the first signal wiring, and extend from board B to board E and primarily in the wiring region 23A. Preferably, a portion of these internal electrodes is connected to the internal ground electrode 26A, another portion thereof extends through an opening provided inside the internal ground electrode 26A and is connected to a mounting electrode, and another portion thereof is connected between surface electrodes. Internal wirings extending to the surface electrode 21B include an internal wiring corresponding to the second signal wiring, and extend from board B to board E and primarily in the wiring region 23B. Preferably, a portion of these internal electrodes is connected to the internal ground electrode 26B, another portion thereof is connected to a mounting electrode, and another portion thereof is connected between surface electrodes. Internal wirings extending to the surface electrode 21C include an internal wiring corresponding to the power supply wiring, and extend from board B to board E and primarily in the wiring region 23B. Preferably, a portion of these internal electrodes is connected to the internal ground electrode 26B, another portion thereof is connected to a mounting electrode, and another portion thereof is connected between surface electrodes.

In the above-described configuration, the internal ground electrode 26A and the internal ground electrode 26B are separated from each other by a slit. Then, all of the internal wirings provided in the wiring region 23A do not extend into the wiring region 23B, and are separated from the reception system terminals and the DC system terminals of the switch IC 2. All of the internal wirings provided in the wiring region 23B do not extend into the wiring region 23A, and are separated from the transmission system terminals of the switch IC 2. Due to this arrangement, the isolation between the internal wirings provided in the wiring region 23A and the internal wirings provided in the wiring region 23B is increased.

Therefore, even if power noise is superimposed on the internal wirings provided in the wiring region 23B, the power noise does not significantly propagate from the internal ground electrode 26B to the internal ground electrode 26A, and leakage of power noise to the transmission system terminals of the switch IC is prevented.

Further, noise does not significantly propagate from the internal ground electrode 26B to the internal ground electrode 26A, and, for example, the transmission signal itself does not leak as noise from the internal wirings provided in the wiring region 23B to the internal wirings provided in the wiring region 23A.

It should be noted that as the multilayer board, a low-temperature-sintered ceramic board obtained by alternately laminating and sintering electrodes of ceramic and Ag, Cu, or other suitable material, a multilayer board for which a resin, such as a liquid crystal polymer is used, or other suitable multilayer boards can be used, for example.

Next, a high-frequency switch module according to a fourth preferred embodiment of the present invention will be described. In the following description, the same components as those in the first preferred embodiment are designated by the same reference signs, and the description thereof is omitted.

Figure 5:
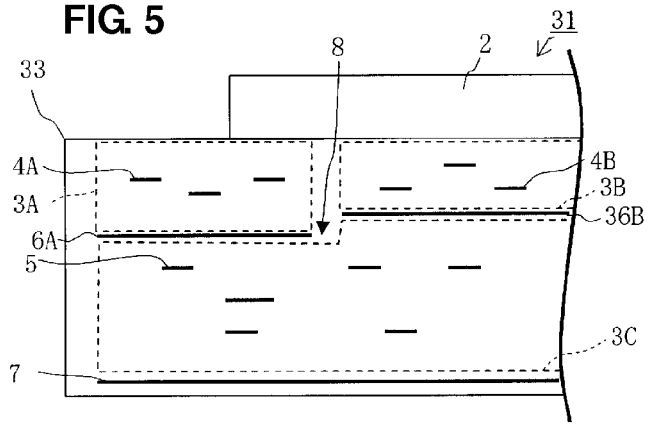
FIG. 5 is a view of an exemplary configuration of a high-frequency switch module according to a fourth preferred embodiment of the present invention.

FIG. 5 is a partial cross-sectional view of the high-frequency switch module according to the fourth preferred embodiment. The high-frequency switch module 31 of the fourth preferred embodiment differs from the high-frequency switch module of the first preferred embodiment in that, preferably, the internal ground electrode 6B is not provided and an internal ground electrode 36B is preferably provided on a board interface in a multilayer board 33 that is different from the board interface on which the internal ground electrode 6A is provided. Due to this configuration, the interval between the internal ground electrode 36B and the internal ground electrode 6A is increased, and thus, the isolation between the internal ground electrode 36B and the internal ground electrode 6A is increased.

Next, a high-frequency switch module according to a fifth preferred embodiment of the present invention will be described. In the following description, the same components as those in the first preferred embodiment are designated by the same reference signs, and the description thereof is omitted.

Figure 6:
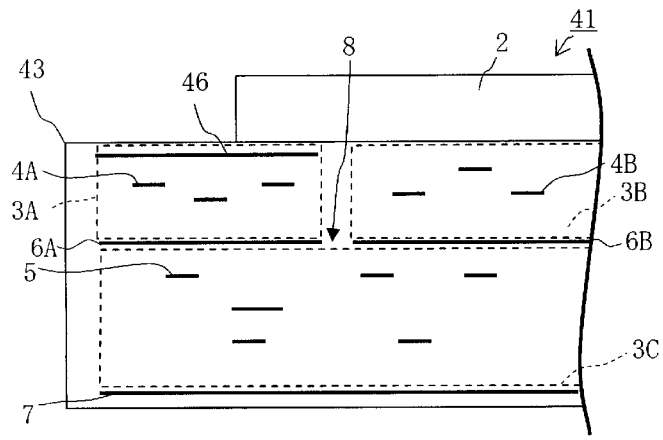
FIG. 6 is a view of an exemplary configuration of a high-frequency switch module according to a fifth preferred embodiment of the present invention.

FIG. 6 is a partial cross-sectional view of the high-frequency switch module according to the fifth preferred embodiment. The high-frequency switch module 41 of the fifth preferred embodiment differs from the high-frequency switch module of the first preferred embodiment in that a multilayer board 43 preferably includes an internal ground electrode 46. The internal ground electrode 46 is preferably provided in the wiring region 3A and on a board interface within the multilayer board 43 that is adjacent to the top surface of the multilayer board 43, and corresponds to a fourth internal ground electrode. Therefore, the internal wirings 4A are sandwiched between the internal ground electrode 46 and the internal ground electrode 6A. Due to this arrangement, leakage of noise from the internal wirings 4A is reduced.

Figure 7A:
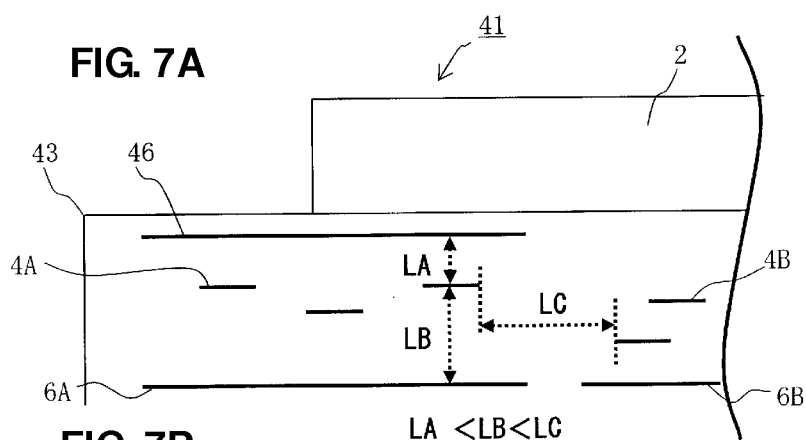
FIGS. 7A and 7B are views of an exemplary electrode arrangement according to another preferred embodiment of the present invention.
Figure 7B:
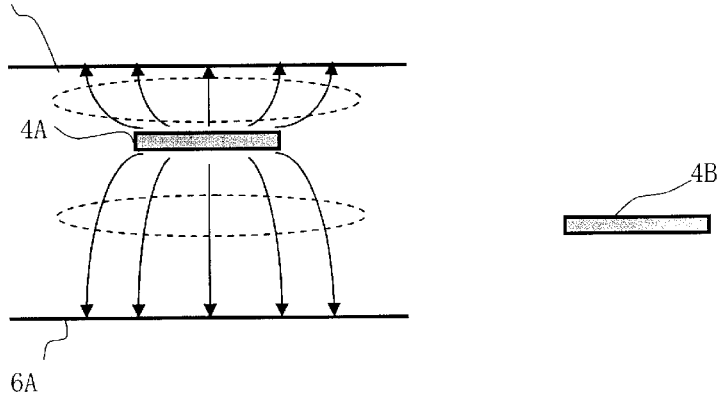

FIGS. 7A and 7B are views illustrating an exemplary electrode arrangement according to a preferred embodiment of the present invention.

As shown in FIG. 7A, the internal wiring 4A closest to the internal wiring 4B is preferably arranged such that an interval LC is greater than intervals LA and LB. The interval LC is an interval to the internal wiring 4B closest to the internal wiring 4A along the board interface. The interval LB is an interval from the internal wiring 4A to the internal ground electrode 6A along an axis perpendicular or substantially perpendicular to the board interface. The interval LA is an interval from the internal wiring 4A to the internal ground electrode 46 along the axis perpendicular or substantially perpendicular to the board interface.

With the electrode arrangement in which the interval LC is greater than the intervals LA and LB as described above, electromagnetic waves generated around the internal wiring 4A are concentrated between the internal ground electrodes 6A and 46 and do not reach the internal wiring 4B, as shown in FIG. 7B. Therefore, even if power noise is superimposed on the internal wiring 4A, unwanted electromagnetic waves generated by the power noise do not reach the internal wiring 4B. Due to this, leakage of power noise from the internal wiring 4A to the internal wiring 4B is effectively prevented.

Even with a configuration other than that shown in the above-described preferred embodiments of the present invention, preferred embodiments of the present invention can suitably be implemented in various configurations. For example, the high-frequency switch module according to various preferred embodiments of the present invention may be configured as a duplexer that separates a transmission signal and a reception signal of a single communication system, or the high-frequency switch module according to various preferred embodiments of the present invention may be configured as a multiplexer that separates high-frequency signals of multiple communication systems such as GSM and UTMS. Preferred embodiments of the present invention can suitably be implemented by at least dividing the internal ground electrode into a plurality of portions and causing at least one of the power supply wiring and the signal wiring to correspond to the separate internal ground electrode.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A high-frequency switch module comprising:
   a multilayer board including insulating material layers and electrodes that are laminated on one another;
   a switch IC mounted on the multilayer board;
   a power supply wiring arranged to supply power to the switch IC;
   a first signal wiring through which a first high-frequency signal propagates; and
   first and second internal ground electrodes, a slit being provided between the first and second internal ground electrodes such that the first and second internal ground electrodes are spaced apart from each other by an interval defined by the slit when viewed in plan from above the switch IC; wherein
   an entire or substantially an entire first internal wiring located on the switch IC side of the first internal ground electrode is separated from the first signal wiring, and at least a portion of the first internal wiring includes the power supply wiring; and
   an entire or substantially an entire second internal wiring located on the switch IC side of the second internal ground electrode is separated from the power supply wiring, and at least a portion of the second internal wiring includes the first signal wiring.

2. The high-frequency switch module according to claim 1, further comprising:
   a second signal wiring through which a second high-frequency signal propagates;
   a third internal ground electrode spaced apart from the first internal ground electrode and the second internal ground electrode by an interval when viewed from the lamination direction of the multilayer board; wherein
   the entire or substantially the entire first internal wiring located on the switch IC side of the first internal ground electrode is separated from the second signal wiring;
   the entire or substantially the entire second internal wiring located on the switch IC side of the second internal ground electrode is separated from the second signal wiring; and
   an entire or substantially an entire third internal wiring located on the switch IC side of the third internal ground electrode is separated from the first signal wiring and the power supply wiring, and at least a portion of the third internal wiring defines the second signal wiring.

3. The high-frequency switch module according to claim 1, further comprising:

a second signal wiring through a second high-frequency signal propagates; and a third internal ground electrode located on an insulating material layer different from an insulating material layer on which the first and second internal ground electrodes are located; wherein the entire or substantially the entire first internal wiring located on the switch IC side of the first internal ground electrode is separated from the second signal wiring;

the entire or substantially the entire second internal wiring located on the switch IC side of the second internal ground electrode is separated from the second signal wiring; and an entire or substantially an entire third internal wiring located on the switch IC side of the third internal ground electrode is separated from the first signal wiring and the power supply wiring, and at least a portion of the third internal wiring defines the second signal wiring.

4. The high-frequency switch module according to claim 1, further comprising:

a second signal wiring through which a second high-frequency signal propagates; wherein at least a portion of the first internal wiring located on the switch IC side of the first internal ground electrode includes the second signal wiring; and the entire or substantially the entire second internal wiring located on the switch IC side of the second internal ground electrode is separated from the second signal wiring.

5. The high-frequency switch module according to claim 2, wherein the first high-frequency signal is a transmission signal, and the second high-frequency signal is a reception signal.

6. The high-frequency switch module according to claim 1, wherein the switch IC is arranged so as to overlap with the first internal ground electrode when viewed from the lamination direction of the multilayer board.

7. The high-frequency switch module according to claim 1, further comprising:

a third internal ground electrode located on the switch IC side of the internal wiring located on the switch IC side of the first internal ground electrode, so as to overlap with the first internal ground electrode when viewed from the lamination direction of the multilayer board.

8. The high-frequency switch module according to claim 1, wherein the first internal ground electrode and the second ground electrode are spaced apart from one another at an interval that is less than an interval at which the first internal wiring and the second internal wiring are spaced apart from one another.

9. The high-frequency switch module according to claim 1, wherein the first internal ground electrode and the second internal ground electrode are disposed on different layers of the multilayer board.

* * * * *